United States Patent
Komuro

[19]

[11] Patent Number: 6,084,436
[45] Date of Patent: Jul. 4, 2000

[54] MULTI-INPUT SEMICONDUCTOR LOGIC DEVICE WITH MASK PATTERN FOR REDUCED PARASITIC CAPACITANCE

[75] Inventor: Toshio Komuro, Tokyo, Japan

[73] Assignee: NEC Corporation, Tokyo, Japan

[21] Appl. No.: 08/957,134

[22] Filed: Oct. 24, 1997

[30]  Foreign Application Priority Data

Oct. 24, 1996 [JP] Japan ................................. 8-282309

[51] Int. Cl.$^7$ ........................... H03K 19/20; H01L 29/76
[52] U.S. Cl. ........................... 326/112; 257/393; 257/401
[58] Field of Search ................................. 326/101, 102, 326/15, 105, 106, 121, 112, 109, 108, 110; 257/341, 401, 393, 408

[56]  References Cited

U.S. PATENT DOCUMENTS

| | | | |
|---|---|---|---|
| 4,494,020 | 1/1985 | Konishi | 326/112 X |
| 4,547,681 | 10/1985 | Egawa | 326/112 X |
| 4,716,308 | 12/1987 | Matsuo et al. | 326/121 |
| 5,016,077 | 5/1991 | Sato et al. | 257/408 |

FOREIGN PATENT DOCUMENTS

| | | |
|---|---|---|
| 49-90886 | 8/1974 | Japan . |
| 56-125854 | 10/1981 | Japan . |
| 60-165111 | 8/1985 | Japan . |
| 2-290056 | 11/1990 | Japan . |
| 4-251976 | 9/1992 | Japan . |

*Primary Examiner*—Michael Tokar
*Assistant Examiner*—Patrick Wamsley
*Attorney, Agent, or Firm*—Young & Thompson

[57] ABSTRACT

A multi-input semiconductor logic device capable of high-speed operation includes a first to fifth source/drain regions formed in an active area, and first to fourth gate electrodes formed over the active area through a gate insulating layer. The first to fifth source/drain regions are arranged along an axis of the active area. The second and fourth source/drain regions are located to be adjacent to the first source/drain region at each side of the first source/drain region. The third and fifth source/drain regions are located to be adjacent to the second and fourth source/drain regions, respectively. The first gate electrode is located between the first and second source/drain regions. The second gate electrode is located between the first and fourth source/drain regions. The third gate electrode is located between the second and third source/drain regions. The fourth gate electrode is located between the fourth and fifth source/drain regions. The first and fourth gate electrodes are electrically connected to be applied with a first digital input signal. The second and third gate electrodes are electrically connected to be applied with a second digital input signal. The third and fifth source/drain regions are electrically connected.

6 Claims, 8 Drawing Sheets

MULTI-INPUT SEMICONDUCTOR LOGIC DEVICE WITH MASK PATTERN FOR REDUCED PARASITIC CAPACITANCE

BACKGROUND OF THE INVENTION

1. Field of the Invention

The present invention relates to a semiconductor device and more particularly, to a multi-input semiconductor logic device having a logic function such as an AND, OR, NOT, NAND, and NOR, in which an output signal has an approximately constant switching speed independent of the logic condition or state of input signals.

2. Description of the Prior Art

In general, a multi-input logic circuit with the Complementary Metal-Oxide-Semiconductor (CMOS) configuration is expressed as the combination of basic logic subcircuits such as AND, OR, and NOT.

In the mask design for these basic logic subcircuits to be used for a multi-input semiconductor logic device, it is important that the "artwork" (i.e., mask pattern) is made to minimize the parasitic capacitance of the semiconductor logic device. This is because the minimized parasitic capacitance contributes to high-speed operation of the logic device and makes it possible to decrease the electric power dissipation thereof.

Additionally, it is important that the artwork is made to minimize the parasitic resistance of the logic device.

Figure 1:
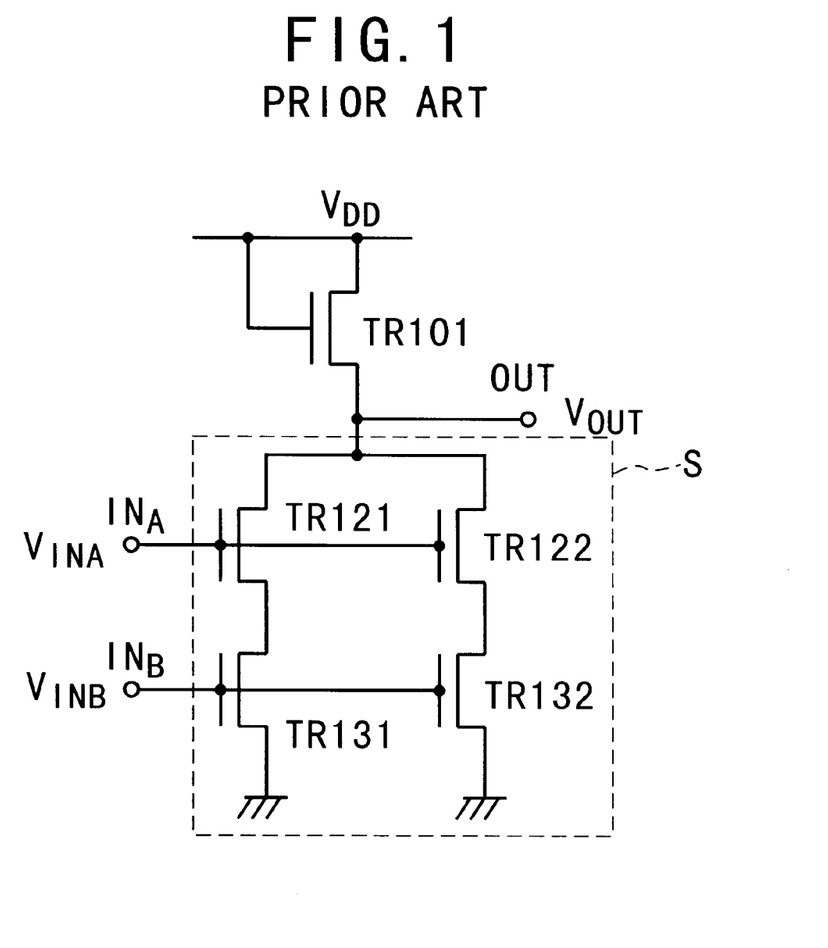
FIG. 1 is a circuit diagram of a two-input MOS NAND circuit, in which a conventional artwork or layout of MOSFETs is used.
Figure 2:
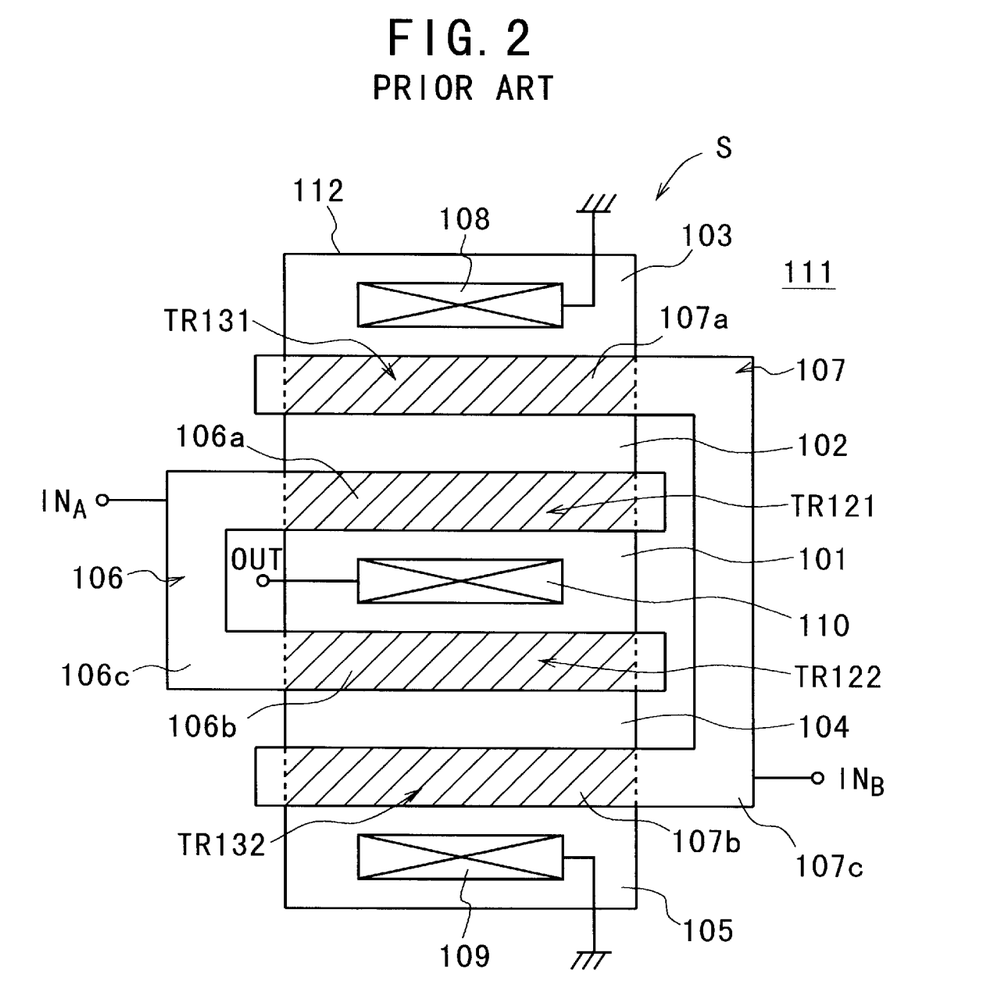
FIG. 2 is a diagram showing the conventional artwork or layout of MOSFETs shown in FIG. 1.

To realize the minimization of the parasitic capacitance and parasitic resistance, conventionally, various improvements have been provided. An example of the conventional improved artworks or layout and a corresponding circuit configuration are shown in FIGS. 2 and 1, respectively, which was disclosed in the Japanese Non-Examined Patent Publication No. 56-125854 published in 1981. This conventional artwork has been practically used.

As shown in FIG. 1, the conventional two-input MOS NAND circuit has a first pair of n-channel driver MOS Field-Effect Transistors (MOSFETs) TR121 and TR122, a second pair of n-channel driver MOSFETs TR131 and TR132, and an n-channel load MOSFET TR101.

A drain and a gate of the load MOSFET TR101 are electrically connected to a power supply (riot shown) supplying a constant voltage $V_{DD}$. A source of the load MOSFET TR101 is electrically connected to an output terminal OUT and coupled drains of the driver MOSFETs TR121 and TR122.

Gates of the driver MOSFETs TR121 and TR122 are coupled together to be electrically connected to a first input terminal $IN_A$. Gates of the driver MOSFETs TR131 and TR132 are coupled together to be electrically connected to a second input terminal $IN_B$. Sources of the driver MOSFETs TR121 and TR122 are electrically connected to drains of the driver MOSFETs TR131 and TR132, respectively. In other words, the driver MOSFETs TR121 and TR131 are connected in series, and the driver MOSFETs TR122 and TR132 are connected in series. Sources of the driver MOSFETs TR131 and TR132 are electrically connected to the ground.

The artwork or layout pattern of the conventional two-input NAND circuit in FIG. 1 is shown in FIG. 2. Only the artwork of the area S including the four driver MOSFETs TR121, TR122, TR131, and TR132 is shown in FIG. 2 for the sake of simplification.

In FIG. 2, the reference numerals 111 and 112 denote a p-type semiconductor substrate and a rectangular active area, respectively. The active area 112 is formed in the substrate 111. Five n-type source/drain regions 101, 102, 103, 104, and 105 are formed to be separated and to be electrically isolated from one another in the active area 112. The source/drain regions 101, 102, 103, 104, and 105 are arranged along the longitudinal axis of the active area 112. The n-type source/drain regions 101, 102, 103, 104, and 105 each have a rectangular shape.

The source/drain region 101 is located at the middle of the active area 112. The source/drain regions 102 and 104 are located at each side of the source/drain region 101. The source/drain regions 103 and 105 are located at each side of the source/drain region 101 to be adjacent to the source/drain regions 102 and 104, respectively.

The source/drain region 101 serves as the drains (or, common drain) of the MOSFETs TR121 and TR122. The source/drain region 102 serves as the source of the MOSFET TR121 and the drain of the MOSFET TR131. The source/drain region 103 serves as the source of the MOSFET TR131. The source/drain region 104 serves as the source of the MOSFET TR122 and the drain of the MOSFET TR132. The source/drain region 105 serves as the source of the MOSFET TR132.

An electrically-conductive layer 106, which has a U-shaped pattern, is formed to be overlapped with the active area 112 at its two arms. An overlapped part 106a of the layer 106 is located between the source/drain regions 101 and 102. Another overlapped part 106b of the layer 106 is located between the source/drain regions 101 and 104. A connection part 106c of the layer 106 is located outside the active area 112 on the left-hand side in FIG. 2. The overlapped parts 106a and 106b serve as gate electrodes of the MOSFETs TR121 and 122, respectively.

An electrically-conductive layer 107, which has a U-shaped pattern, is formed to be overlapped with the active area 112 at its two arms. An overlapped part 107a of the layer 107 is located between the source/drain regions 102 and 103. Another overlapped part 107b of the layer 107 is located between the source/drain regions 104 and 105. A connection part 107c of the layer 107 is located outside the active area 112 on the right-hand side in FIG. 2. The overlapped parts 107a and 107b serve as gate electrodes of the MOSFETs TR131 and 132, respectively.

An electrically-conductive contact 110 is formed on the source/drain region 101 to be contacted therewith. The source/drain region 101, which serves as the drain regions of the MOSFETs TR121 and TR122, is electrically connected to the output terminal OUT through the contact 110.

An electrically-conductive contact 108 is formed on the source/drain region 103 to be contacted therewith. The source/drain region 103, which serves as the source region of the MOSFET TR131, is electrically connected to the ground through the contact 108.

An electrically-conductive contact 109 is formed on the source/drain region 105 to be contacted therewith. The source/drain region 105, which serves as the source region of the MOSFET TR132, is electrically connected to the ground through the contact 109.

As described above, with the conventional artwork shown in FIG. 2, the combination of the two MOSFETs TR121 and TR122 or that of the two MOSFETs TR131 and TR132 is equivalent to a single MOSFET having a channel (or, gate electrode) width twice as large as that of the MOSFET TR121 or TR122. Therefore, the combination of the two MOSFETs TR121 and TR122 or TR131 and TR132 is less in both parasitic capacitance and parasitic resistance than the equivalent single MOSFET.

The conventional artwork shown in FIG. 2, however, has a problem that the switching speed of the output signal varies dependent upon the prior logic state of the two input signals.

Specifically, it is supposed that a first digital input signal $V_{INA}$ to be applied to the first input terminal $IN_A$ is in the high level or the 1 state, and a second digital input signal $V_{INB}$ to be applied to the second input terminal $IN_B$ is in the low level or the 0 state. This logic condition or state is expressed as (1,0) in this specification.

When the first and second input signals $V_{INA}$ and $V_{INB}$ are turned from the state (1,0) to the state (1,1), an output signal $V_{OUT}$ to be derived from the output terminal OUT is turned from the 1 state to the 0 state. When the first and second input signals $V_{INA}$ and $V_{INB}$ are turned from the state (0,1) to the state (1,1), the output signal $V_{OUT}$ is turned from the 1 state to the 0 state, which is the same as that of the signal change from the state (1,0) to the state (1,1). However, the switching or turning speed of the output signal $V_{OUT}$ in the former case of (1,0) to (1,1) is slower than that in the latter case of (0,1) to (1,1). The reason is as follows.

In the former case of (1,0) to (1,1), the MOSFETs TR121 and TR122 are ON (i.e., conductive) while the MOSFETs TR131 and TR132 are OFF in the state (1,0). The load MOSFET TR101 is always ON. Therefore, the drains of the MOSFETs TR131 and TR132 are in a voltage level of $V_{DD}$. This means that electric charges are stored in parasitic capacitors existing in the neighborhood of the source/drain regions 102 and 104 and that electric charges are stored in parasitic capacitors existing in the neighborhood of the source/drain region 101. As a result, the stored charges in the parasitic capacitors relating to the source/drain regions 102 and 104 need to be discharged at the switching time from the (1,0) to (1,1), thereby increasing the switching time of the output signal $V_{OUT}$.

On the other hand, in the latter case of (0,1) to (1,1), the MOSFETs TR121 and TR122 are OFF while the MOSFETs TR131 and TR132 are ON in the state (0,1). Therefore, the drains of the MOSFETs TR131 and TR132 are in a voltage level of 0, i.e., in the ground level. This means that electric charges are stored in the parasitic capacitors existing in the neighborhood of the source/drain region 101, and that no electric charges are stored in the parasitic capacitors existing in the neighborhood of the source/drain regions 102 and 104. As a result, the stored charges in the parasitic capacitors relating to the source/drain region 101 need to be discharged at the switching time from the (0,1) to (1,1), thereby increasing the switching time of the output signal $V_{OUT}$.

Because the stored charges in the parasitic capacitors relating to the source/drain regions 102 and 104 are greater than those in the parasitic capacitors relating to the source/drain region 101, the switching time of the output signal $V_{OUT}$ in the case of (1,0) to (1,1) is longer than that in the case of (0,1) to (1,1). In other words, the switching or turning of the output signal $V_{OUT}$ in the case of (1,0) to (1,1) occurs later than that in the case of (0,1) to (1,1).

The same phenomenon occurs in the case where the output signal $V_{OUT}$ is turned from the 0 state to the 1 state.

For example, the parasitic capacitors relating to the source/drain regions 102 and 104 are typically formed by the combination of (a) the source/drain regions 102 and 104 and the corresponding gate electrodes 106a and 106b, (b) the source/drain regions 102 and 104 and the substrate, and (c) the source/drain regions 102 and 104 and wiring or interconnection layers (not shown in FIGS. 1 and 2).

The above switching speed or time difference of the output signal $V_{OUT}$ varies dependent upon the size of the MOSFETs TR121, TR122, TR131, and TR132.

The above switching speed difference requires a comparatively large margin in design of an operation timing or clock signal of the semiconductor logic device including the conventional two-input MOS NAND circuit. This large margin will lower the operation speed of the device.

SUMMARY OF THE INVENTION

Accordingly, an object of the present invention is to provide a multi-input semiconductor logic device capable of high-speed operation.

Another object of the present invention is to provide a multi-input semiconductor logic device having a small switching speed difference of an output signal.

The above objects together with others not specifically mentioned will become clear to those skilled in the art from the following description.

According to a first aspect of the present invention, a two-input semiconductor logic device is provided. This device is comprised of an active area formed in a semiconductor substrate, first, second, third, fourth, and fifth source/drain regions formed in the active area, and first, second, third, and fourth gate electrodes formed over the active area through a gate insulating layer.

The first, second, third, fourth, and fifth source/drain regions are arranged along an axis of the active area. The first source/drain region is located at a middle position of the active area. The second and fourth source/drain regions are located to be adjacent to the first source/drain region at each side of the first source/drain region. The third and fifth source/drain regions are located to be adjacent to the second and fourth source/drain regions, respectively.

The first gate electrode is located between the first and second source/drain regions. The second gate electrode is located between the first and fourth source/drain regions. The third gate electrode is located between the second and third source/drain regions. The fourth gate electrode is located between the fourth and fifth source/drain regions.

The first and second source/drain regions and the first gate electrode constitute a first Insulated-Gate FET (IGFET). The first and fourth source/drain regions and the second gate electrode constitute a second IGFET. The second and third source/drain regions and the third gate electrode constitute a third IGFET. The fourth and fifth source/drain regions and the fourth gate electrode constitute a fourth IGFET.

The first and fourth gate electrodes are electrically connected to one another to be applied with a first digital input signal. The second and third gate electrodes are electrically connected to one another to be applied with a second digital input signal. The third and fifth source/drain regions are electrically connected to one another.

A digital output signal is derived from the first source/drain region or the electrically-connected third and fifth source/drain regions.

With the two-input semiconductor logic device according to the first aspect of the present invention, (a) when the first input signal is in a logic high level and the second input signal is in a logic low level, the first and fourth IGFETs are ON and the second and third IGFETs are OFF. In this case, electric charges are stored in the first and second source/drain regions (or, the first and fourth source/drain regions) and their neighboring parasitic capacitors.

On the other hand, (b) when the second input signal is in a logic high level and the first input signal is in a logic low level, the first and fourth IGFETs are OFF and the second and third IGFETs are ON. In this case, electric charges are stored in the first and fourth source/drain regions (or, the first and second source/drain regions) and their neighboring parasitic capacitors.

Therefore, the amount of the stored electric charges to be discharged at a next timing or clock period will be approximately the sate in the above two cases (a) and (b). This means that a switching speed difference of the output signal between the cases (a) and (b) is small or zero. This leads to high-speed operation of the logic device.

In a preferred embodiment of the device according to the first aspect of the present invention, one of the first source/drain region and the electrically-connected third and fifth source/drain regions from which the output signal is not derived is/are electrically connected to a power supply line or a ground line.

In another preferred embodiment of the device according to the first aspect of the present invention, the output signal has a NAND logic with respect to the first and second input signals.

According to a second aspect of the present invention, a three-input semiconductor logic device is provided. This device is comprised of an active area formed in a semiconductor substrate, first to nineteenth source/drain regions formed in the active area, and first to eighteenth gate electrodes formed over the active area through a gate insulating layer.

The first to nineteenth source/drain regions are arranged along an axis of the active area. The second and fifth source/drain regions are located to be adjacent to the first source/drain region at each side of the first source/drain region. The third and sixth source/drain regions are located to be adjacent to the second and fifth source/drain regions, respectively. The fourth and seventh source/drain regions are located to be adjacent to the third and sixth source/drain regions, respectively.

The first gate electrode is located between the first and second source/drain regions. The second gate electrode is located between the first and fifth source/drain regions. The third gate electrode is located between the second and third source/drain regions. The fourth gate electrode is located between the fifth and sixth source/drain regions. The fifth gate electrode is located between the third and fourth source/drain regions. The sixth gate electrode is located between the sixth and seventh source/drain regions.

The first and second gate electrodes are electrically connected to one another to be applied with a first digital input signal. The third and sixth gate electrodes are electrically connected to one another to be applied with a second digital input signal. The fourth and fifth gate electrodes are electrically connected to one another to be applied with a third digital input signal.

The ninth and eleventh source/drain regions are located to be adjacent to the eighth source/drain region at each side of the eighth source/drain region. The tenth and twelfth source/drain regions are located to be adjacent to the ninth and eleventh source/drain regions, respectively. The seventh and thirteenth source/drain regions are located to be adjacent to the tenth and twelfth source/drain regions, respectively.

The seventh gate electrode is located between the eighth and ninth source/drain regions. The eighth gate electrode is located between the eighth and eleventh source/drain regions. The ninth gate electrode is located between the ninth and tenth source/drain regions. The tenth gate electrode is located between the tenth and seventh source/drain regions. The eleventh gate electrode is located between the eleventh and twelfth source/drain regions. The twelfth gate electrode is located between the twelfth and thirteenth source/drain regions.

The seventh and eighth gate electrodes are electrically connected to one another to be applied with the second input signal. The ninth and twelfth gate electrodes are electrically connected to one another to be applied with the first input signal. The tenth and eleventh gate electrodes are electrically connected to one another to be applied with the third input signal.

The fifteenth and seventeenth source/drain regions are located to be adjacent to the fourteenth source/drain region at each side of the fourteenth source/drain region. The sixteenth and eighteenth source/drain regions are located to be adjacent to the fifteenth and seventeenth source/drain regions, respectively. The thirteenth and nineteenth source/drain regions are located to be adjacent to the sixteenth and eighteenth source/drain regions, respectively.

The thirteenth gate electrode is located between the fourteenth and fifteenth source/drain regions. The fourteenth gate electrode is located between the fourteenth and seventeenth source/drain regions. The fifteenth gate electrode is located between the fifteenth and sixteenth source/drain regions. The sixteenth gate electrode is located between the seventeenth and eighteenth source/drain regions. The seventeenth gate electrode is located between the thirteenth and sixteenth source/drain regions. The eighteenth gate electrode is located between the eighteenth and nineteenth source/drain regions.

The thirteenth and fourteenth gate electrodes are electrically connected to one another to be applied with the third input signal. The fifteenth and eighteenth gate electrodes are electrically connected to one another to be applied with the second input signal. The sixteenth and seventeenth gate electrodes are electrically connected to one another to be applied with the first input signal.

The first and second source/drain regions and the first gate electrode constitute a first IGFET. The first and fifth source/drain regions and the second gate electrode constitute a second IGFET. The second and third source/drain regions and the third gate electrode constitute a seventh IGFET. The fifth and sixth source/drain regions and the fourth gate electrode constitute a fourteenth eighth IGFET. The third and fourth source/drain regions and the fifth gate electrode constitute a thirteenth IGFET. The sixth and seventh source/drain regions and the sixth gate electrode constitute an eighth IGFET.

The eighth and ninth source/drain regions and the seventh gate electrode constitute a third IGFET. The eighth and eleventh source/drain regions and the eighth gate electrode constitute a fourth IGFET. The ninth and tenth source/drain regions and the ninth gate electrode constitute a ninth IGFET- The eleventh and twelfth source/drain regions and the tenth gate electrode constitute a tenth IGFET. The seventh and tenth source/drain regions and the eleventh gate electrode constitute a fifteenth IGFET. The twelfth and thirteenth source/drain regions and the twelfth gate electrode constitute a sixteenth IGFET.

The fourteenth and fifteenth source/drain regions and the thirteenth gate electrode constitute a fifth IGFET. The fourteenth and seventeenth source/drain regions and the fourteenth gate electrode constitute a sixth IGFET. The fifteenth and sixteenth source/drain regions and the fifteenth gate electrode constitute an eleventh IGFET. The seventeenth and eighteenth source/drain regions and the sixteenth gate electrode constitute a twelfth IGFET. The thirteenth and sixteenth source/drain regions and the seventeenth gate electrode constitute a seventeenth IGFET. The eighteenth and nineteenth source/drain regions and the eighteenth gate electrode constitute an eighteenth IGFET.

A digital output signal is derived from the electrically-connected first, eighth, and fourteenth source/drain regions or the electrically-connected fourth, seventh, thirteenth, and nineteenth source/drain regions.

With the three-input semiconductor logic device according to the second aspect of the present invention, when one or two ones of the first to third input signals is/are in a logic high level and the remainder is/are in a logic low level, electric charges are stored in the corresponding source/drain regions and their neighboring parasitic capacitors.

The amount of the stored electric charges to be discharged at a next timing or clock period will be approximately the same in the above cases where one or two ones of the first to third input signals is/are in the logic high level and the remainder is/are in the logic low level. This means that a switching speed difference of the output signal between the cases is small or zero. This leads to high-speed operation of the logic device.

In a preferred embodiment of the device according to the second aspect of the present invention, one of the electrically-connected first, eighth, and fourteenth source/drain regions and the electrically-connected fourth, seventh, thirteenth, and nineteenth source/drain regions from which the output signal is not derived are electrically connected to a power supply line or a ground line.

In another preferred embodiment of the device according to the second aspect of the present invention, the output signal has a NAND logic with respect to the first, second, and third input signals.

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described below with reference to the drawings attached.

First Embodiment

Figure 3:
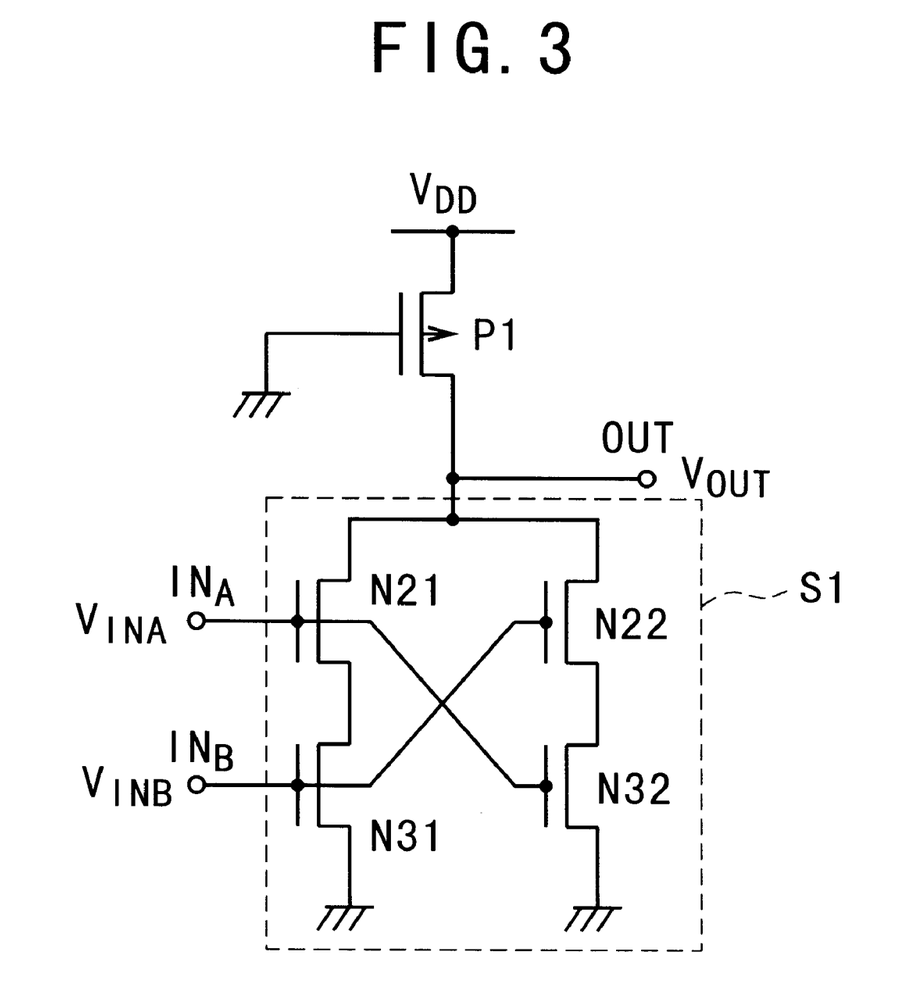
FIG. 3 is a circuit diagram of a two-input semiconductor logic device having an NAND function according to a first embodiment of the present invention.
Figure 4:
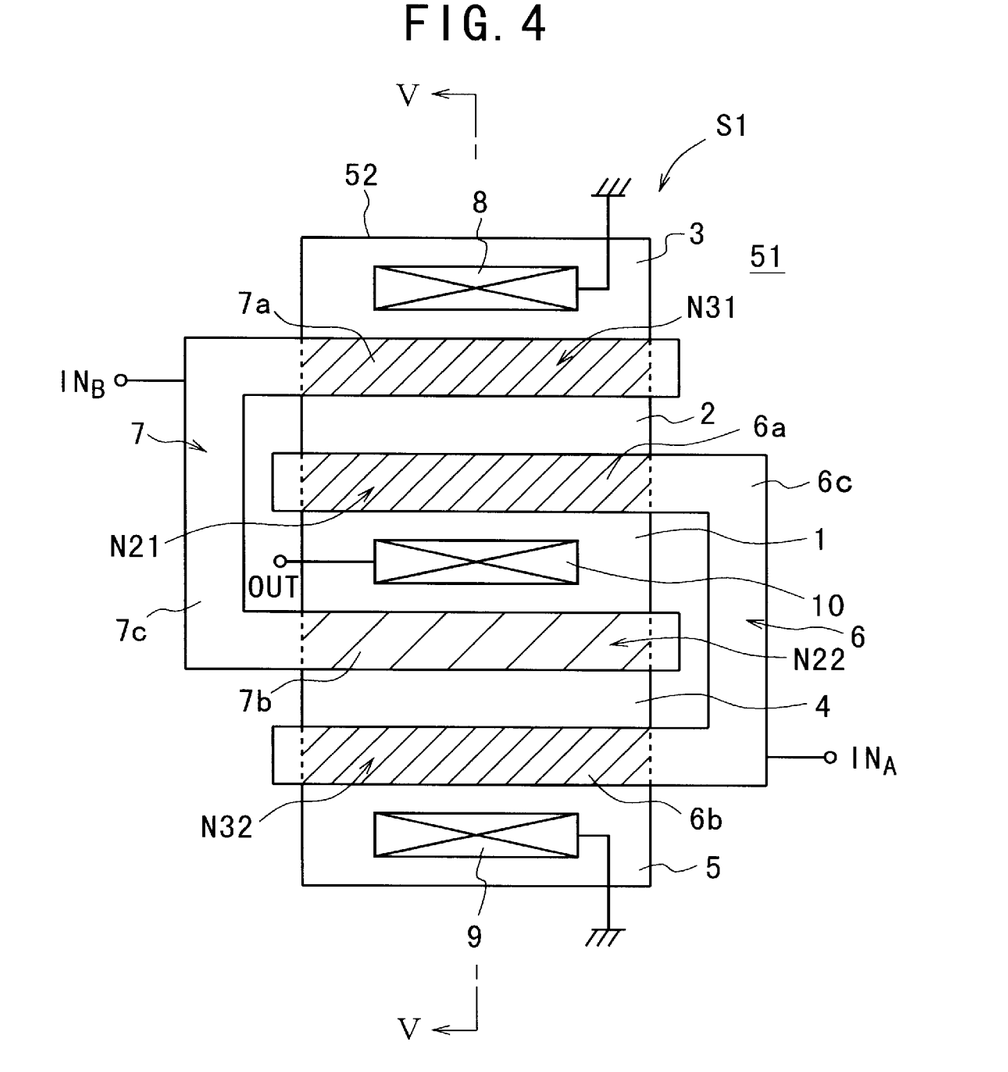
FIG. 4 is a diagram showing the artwork or layout of MOSFETs used in the device according to the first embodiment of the present invention in FIG. 3.
Figure 5:
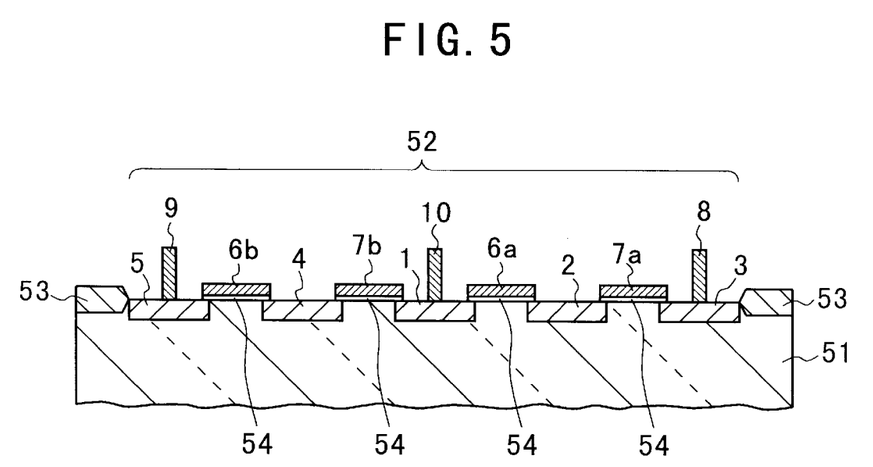
FIG. 5 is a cross-sectional view along the line V—V in FIG. 4.

A two-input semiconductor logic device having an NAND function according to a first embodiment of the present invention is shown in FIGS. 3 to 5.

As shown in FIG. 3, this logic device has first, second, third, and fourth n-channel driver MOSFETs N21, N22, N31, and N32, and a p-channel load MOSFET P1.

A source of the load MOSFET P1 is electrically connected to a power supply (not shown) supplying a constant voltage $V_{DD}$. A gate of the MOSFET P1 is electrically connected to the ground. A drain of the load MOSFET P1 is electrically connected to an output terminal OUT and coupled drains of the first and second driver MOSFETs N21 and N22. A digital output signal $V_{OUT}$ is derived from the output terminal OUT.

Gates of the first and fourth driver MOSFETs N21 and N32 are coupled together to be electrically connected to a first input terminal $IN_A$. Gates of the second and third driver MOSFETs N22 and N31 are coupled together to be electrically connected to a second input terminal $IN_B$. Sources of the first and second driver MOSFETs N21 and N22 are electrically connected to drains of the third and fourth driver MOSFETs N31 and N32, respectively. In other words, the first and third driver MOSFETs N21 and N31 are connected in series, and the second and fourth driver MOSFETs N22 and N32 are connected in series. Sources of the third and fourth driver MOSFETs N31 and N32 are electrically connected to the ground.

The artwork or layout pattern of the two-input logic device according to the first embodiment in FIG. 3 is shown in FIGS. 4 and 5. Only the artwork of the area S1 including the first to fourth driver MOSFETs N21, N22, N31, and N32 is shown in FIGS. 4 and 5 for the sake of simplification.

In FIGS. 4 and 5, the reference numerals 51 and 52 denote a p-type semiconductor substrate and a rectangular active area, respectively. The active area 52 is formed in the substrate 51. The active area 52 is defined by an isolation oxide layer 53 formed on the substrate 51.

Five n-type source/drain regions 1, 2, 3, 4, and 5 are formed in the substrate 51 to be separated and to be electrically isolated from one another in the active area 52. The source/drain regions 1, 2, 3, 4, and 5 are arranged along the longitudinal axis of the active area 52. The n-type source/drain regions 1, 2, 3, 4, and 5 each have substantially a same rectangular shape.

The source/drain region 1 is located at the middle of the active area 52. The source/drain regions 2 and 4 are located at each side of the source/drain region 1. The source/drain regions 3 and 5 are located at each side of the source/drain region 1 to be adjacent to the source/drain regions 2 and 4, respectively.

The source/drain region 1 serves as the drains (or, common drain) of the first and second MOSFETs N21 and N22. The source/drain region 2 serves as the source of the first MOSFET N21 and the drain of the third MOSFET N31. The source/drain region 3 serves as the source of the third MOSFET N31. The source/drain region 4 serves as the source of the second MOSFET N22 and the drain of the fourth MOSFET N32. The source/drain region 5 serves as the source of the fourth MOSFET N32.

An electrically-conductive layer 6, which has a U-shaped pattern, is formed over the substrate 51 through a gate oxide layer 54 to be overlapped with the active area 52 at its two arms. An overlapped part 6a of the layer 6 is located between the source/drain regions 1 and 2. Another overlapped part 6b of the layer 6 is located between the source/drain regions 4 and 5. A connection part 6c of the layer 6 is located outside the active area 52 on the right-hand side in FIG. 4. The overlapped parts 6a and 6b serve as gate electrodes of the first and fourth MOSFETs N21 and N32, respectively.

An electrically-conductive layer 7, which has a U-shaped pattern, is formed over the substrate 51 through the gate oxide layer 54 to be overlapped with the active area 52 at its two arms. An overlapped part 7a of the layer 7 is located between the source/drain regions 2 and 3. Another overlapped part 7b of the layer 7 is located between the source/drain regions 1 and 4. A connection part 7c of the layer 7 is located outside the active area 52 on the left-hand side in FIG. 4. The overlapped parts 7a and 7b serve as gate electrodes of the third and second MOSFETs N31 and N22, respectively.

Layers 6 and layer 7 are positioned so that they interlock one another as shown by FIG. 4.

An electrically-conductive contact 10 is formed on the source/drain region 1 to be contacted therewith. The source/drain region 1, which serves as the drain regions of the first and second MOSFETs N21 and N22, is electrically connected to the output terminal OUT through the contact 10.

An electrically-conductive contact 8 is formed on the source/drain region 3 to be contacted therewith. The source/drain region 3, which serves as the source region of the third MOSFET N31, is electrically connected to the ground through the contact 8.

An electrically-conductive contact 9 is formed on the source/drain region 5 to be contacted therewith. The source/drain region 5, which serves as the source region of the fourth MOSFET N32, is electrically connected to the ground through the contact 9.

With the two-input semiconductor logic device according to the first embodiment of the present invention, (a) when the first input signal voltage $V_{INA}$ is in a logic level of 1 and the second input signal voltage $V_{INB}$ is in a logic level of 0, i.e., in the logic state of (1,0), the first and fourth MOSFETs N21 and N32 are ON and the second and third MOSFETs N22 and N31 are OFF. In this case, electric charges are stored in the source/drain regions 1 and 2 and their neighboring parasitic capacitors.

On the other hand, (b) when the second input signal voltage $V_{INB}$ is in a logic level of 1 and the first input signal $V_{INA}$ is in a logic level of 0, i.e., in the logic state of (0,1), the first and fourth MOSFETs N21 and N32 are OFF and the second and third MOSFETs N22 and N31 are ON. In this case, electric charges are stored in the source/drain regions 1 and 4 and their neighboring parasitic capacitors.

Therefore, the amount of the stored electric charges to be discharged at a next timing or clock period for turning to the logic state of (1,1) will be approximately the same in the above two cases (a) and (b). This means that a switching speed difference of the output signal voltage $V_{OUT}$ between the cases (a) and (b) is zero. This leads to high-speed operation of this logic device because a necessary timing margin is extremely small.

Figure 6:
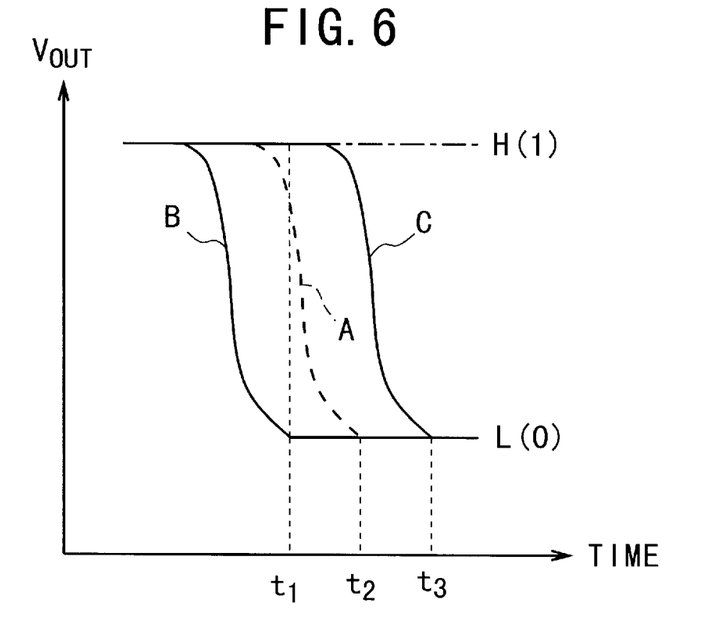
FIG. 6 is a schematic diagram showing the waveform of the output signal $V_{OUT}$ of the two-input semiconductor logic device according to the first embodiment, in which the output signal is turned from the logic state of 1 to 0.

Specifically, as indicated by a curve A in FIG. 6, when the first and second input signal voltages $V_{INA}$ and $V_{INB}$ are turned from the logic state of (1,0) to (1,1), the output signal voltage $V_{OUT}$ in the logic state of 1 is completely turned to the logic state of 0 at the time $t_2$. When the first and second input signal voltages $V_{INA}$ and $V_{INB}$ are turned from the logic state of (0,1) to (1,1), the output signal voltage $V_{OUT}$ in the logic state of 1 is completely turned to the logic state of 0 at the same time $t_2$ along the curve A. This means that the switching time of the output signal voltage $V_{OUT}$ is kept constant independent of the prior logic state of the first and second input signal voltages $V_{INA}$ and $V_{INB}$.

Here, the switching time of the output signal voltage $V_{OUT}$ is defined as a time from the change of at least one of the first and second input signal voltages $V_{INA}$ and $V_{INB}$ to the completion of the turning of the output signal voltage $V_{OUT}$.

Unlike this, with the above conventional logic circuit shown in FIGS. 1 and 2, when the first and second input signal voltages $V_{INA}$ and $V_{INB}$ are turned from the logic state of (1,0) to (1,1), the output signal voltage $V_{OUT}$ in the logic state of 1 is completely turned to the logic state of 0 at the time $t_3$, as indicated by a curve C in FIG. 6. However, when the first and second input signal voltages $V_{INA}$ and $V_{INB}$ are turned from the logic state of (0,1) to (1,1), the output signal voltage $V_{OUT}$ in the logic state of 1 is completely turned to the logic state of 0 at the time $t_1$ along a curve B in FIG. 6.

Therefore, the switching time of the output signal voltage $V_{OUT}$ varies dependent upon the prior logic state of the first and second input signal voltages $V_{INA}$ and $V_{INB}$.

Figure 7:
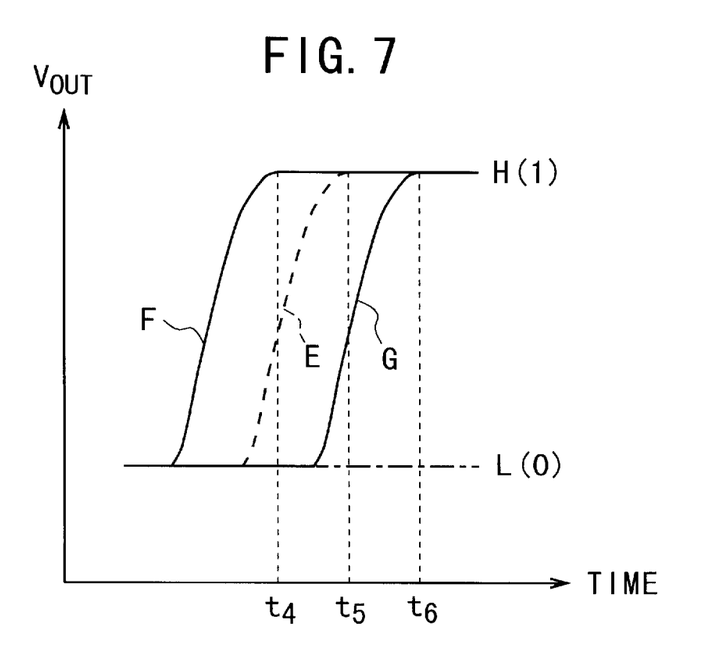
FIG. 7 is a schematic diagram showing the waveform of the output signal $V_{OUT}$ of the two-input semiconductor logic device according to the first embodiment, in which the output signal is turned from the logic state of 0 to 1.

Similarly, when the first and second input signal voltages $V_{INA}$ and $V_{INB}$ are turned from the logic state of (1,1) to (1,0), the output signal voltage $V_{OUT}$ in the logic state of 0 is completely turned to the logic state of 1 at the time $t_5$, as indicated by a curve E in FIG. 7. When the first and second input signal voltages $V_{INA}$ and $V_{INB}$ are turned from the logic state of (1,1) to (0,1), the output signal voltage $V_{OUT}$ in the logic state of 0 is completely turned to the logic state of 1 at the same time $t_5$ along the curve E. This means that the switching time of the output signal voltage $V_{OUT}$ is kept constant independent of the prior logic state of the first and second input signal voltages $V_{INA}$ and $V_{INB}$.

Unlike this, with the above conventional logic circuit shown in FIGS. 1 and 2, when the first and second input signal voltages $V_{INA}$ and $V_{INB}$ are turned from the logic state of (1,1) to (1,0), the output signal voltage $V_{OUT}$ in the logic state of 0 is completely turned to the logic state of 1 at the time $t_6$, as indicated by a curve G in FIG. 7. However, when the first and second input signal voltages $V_{INA}$ and $V_{INB}$ are turned from the logic state of (1,1) to (0,1), the output signal voltage $V_{OUT}$ in the logic state of 0 is completely turned to the logic state of 1 at the time $t_4$ along a curve F in FIG. 7.

Therefore, the switching time of the output signal voltage $V_{OUT}$ varies dependent upon the prior logic state of the first and second input signal voltages $V_{INA}$ and $V_{INB}$.

Additionally, because of the same reason as that of the conventional circuit shown in FIGS. 1 and 2, parasitic capacitance and the parasitic resistance of the logic device according to the first embodiment are limited to a low level. This fact also contributes to high-speed operation.

Second Embodiment

Figure 8:
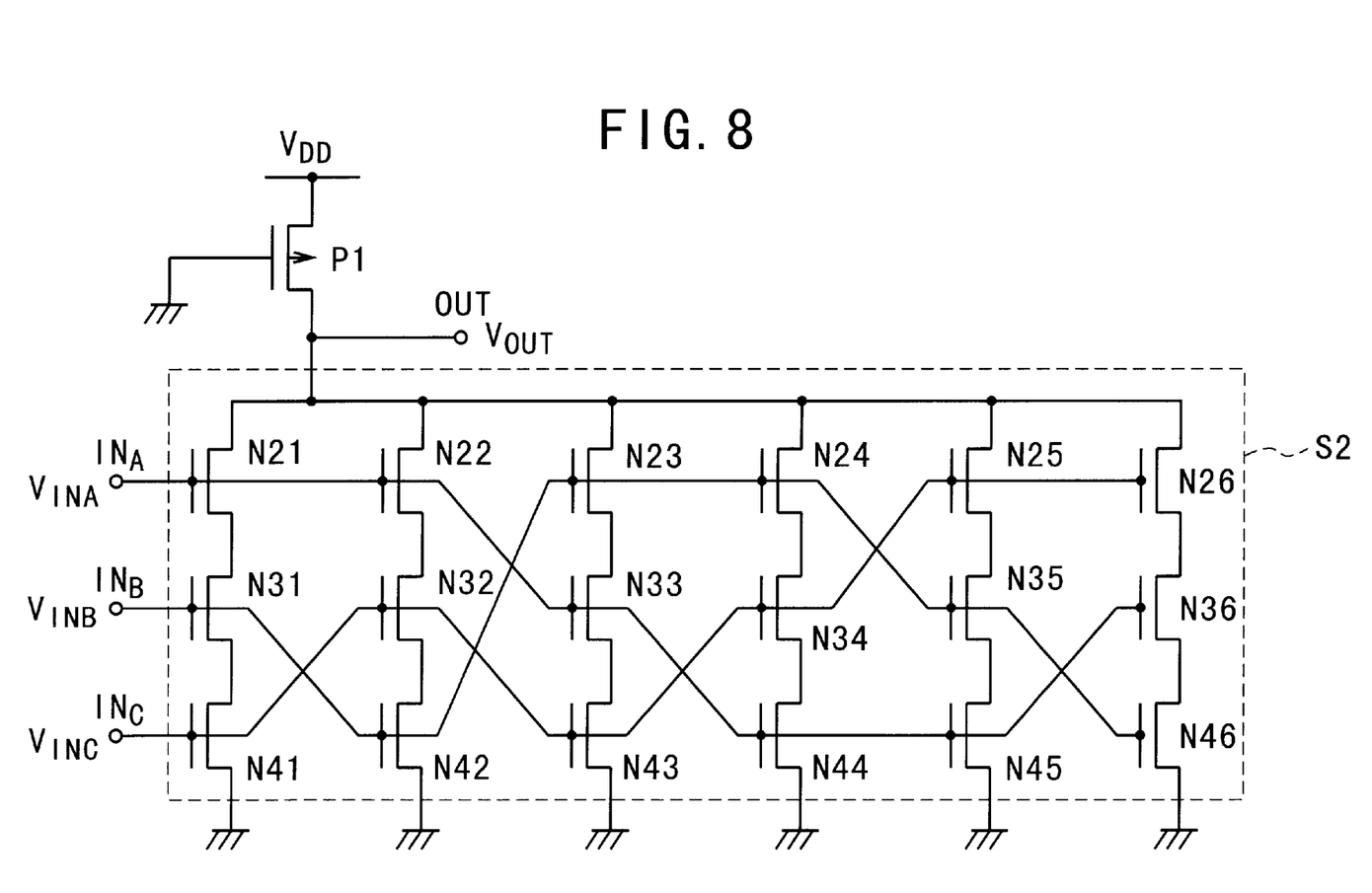
FIG. 8 is a circuit diagram of a three-input semiconductor logic device having an NAND function according to a second embodiment of the present invention.
Figure 9:
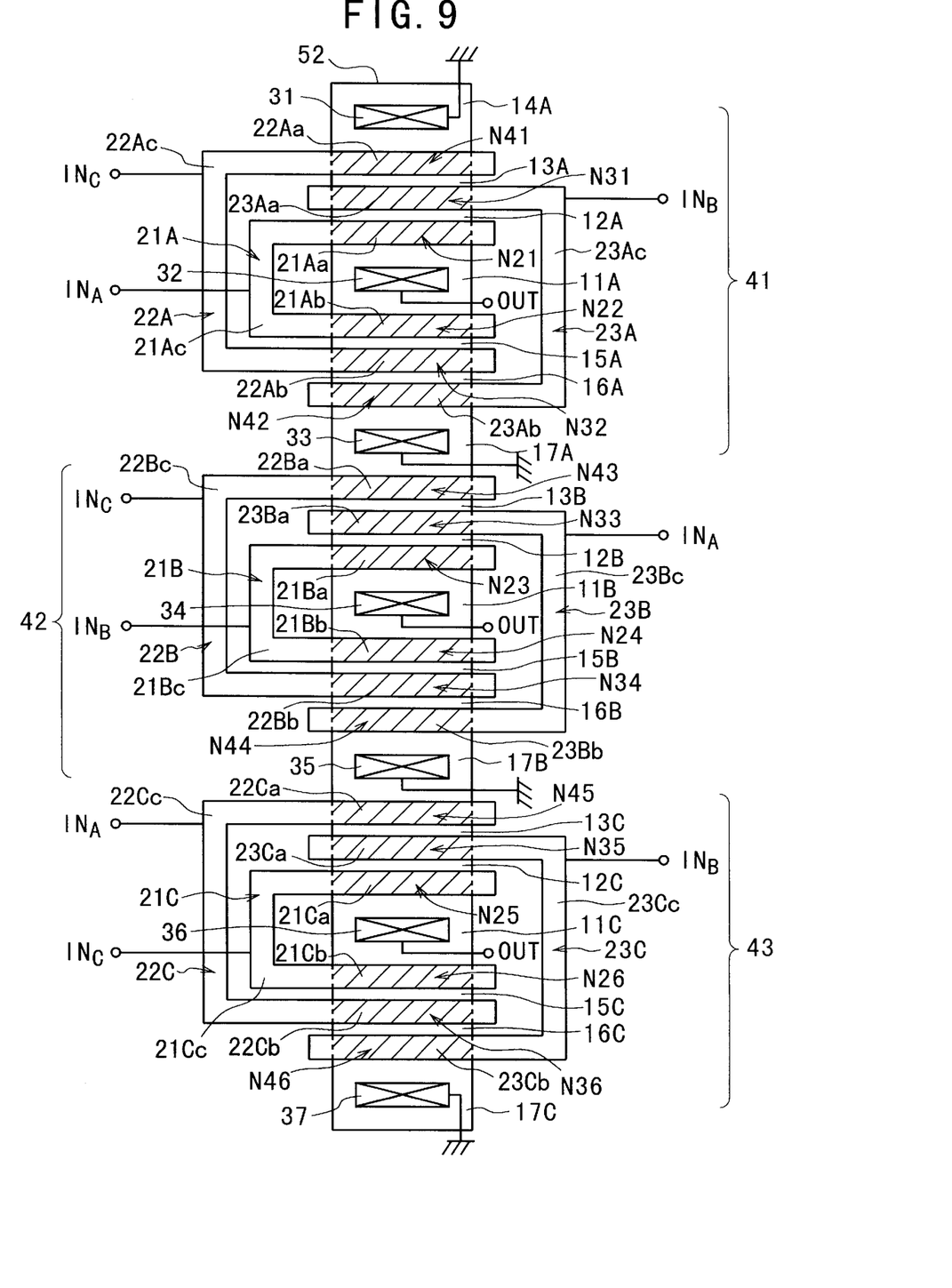
FIG. 9 is a diagram showing the artwork or layout of MOSFETs used in the device according to the second embodiment of the present invention in FIG. 8.

A three-input semiconductor logic device having an NAND function according to a second embodiment of the present invention is shown in FIGS. 8 and 9.

As shown in FIG. 8, this logic device has first to eighteenth n-channel driver MOSFETs N21, N22, N23, N24, N25, N26, N31, N32, N33, N34, N35, N36, N41, N42, N43, N44, N45, and N46, and a p-channel load MOSFET P1.

A source of the load MOSFET P1 is electrically connected to a power supply (not shown) supplying a constant voltage $V_{DD}$. A gate of the MOSFET P1 is electrically connected to the ground. A drain of the MOSFET P1 is electrically connected to an output terminal OUT and coupled drains of the first to sixth driver MOSFETs N21, N22, N23, N24, N25 and N26. A digital output signal $V_{OUT}$ is derived from the output terminal OUT.

Gates of the first, second, ninth, sixteenth, seventeenth, and twelfth driver MOSFETs N21, N22, N33, N44, N45, and N36 are coupled together to be electrically connected to a first input terminal $IN_A$. Gates of the seventh, fourteenth, third, fourth, eleventh, and eighteenth driver MOSFETs N31, N42, N23, N24, N35, and N46 are coupled together to be electrically connected to a second input terminal INB. Gates of the thirteenth, eighth, fifteenth, tenth, fifth, and sixth driver MOSFETs N41, N32, N43, N34, N25, and N26 are coupled together to be electrically connected to a third input terminal $IN_C$.

Sources of the first to sixth driver MOSFETs N21, N22, N23, N24, N25, and N26 are electrically connected to drains of the seventh to twelfth driver MOSFETs N31, N32, N33, N34, N35, and N36, respectively. Sources of the seventh to twelfth driver MOSFETs N31, N32, N33, N34, N35, and N36 are electrically connected to drains of the thirteenth to eighteenth driver MOSFETs N41, N42, N43, N44, N45, and N46, respectively.

Thus, the first, seventh, and thirteenth driver MOSFETs N21, N31, and N41 are connected in series. The second, eighth, and fourteenth driver MOSFETs N22, N32, and N42 are connected in series. The third, ninth, and fifteenth driver MOSFETs N23, N33, and N43 are connected in series. The fourth, tenth, and sixteenth driver MOSFETs N24, N34, and N44 are connected in series. The fifth, eleventh, and seventeenth driver MOSFETs N25, N35, and N45 are connected in series. The sixth, twelfth, and eighteenth driver MOSFETs N26, N36, and N46 are connected in series.

Sources of the thirteenth to eighteenth driver MOSFETs N41, N42, N43, N44, N45, and N46 are electrically connected to the ground.

The artwork or layout pattern of the two-input logic device according to the second embodiment in FIG. 8 is shown in FIG. 9. Only the artwork of the area S2 including the first to eighteenth driver MOSFETs N21, N22, N23, N24, N25, N26, N31, N32, N33, N34, N35, N36, N41, N42, N43, N44, N45, and N46 is shown in FIG. 9 for the sake of simplification.

In FIG. 9, the reference numerals 51 and 52 denote a p-type semiconductor substrate and a rectangular active area, respectively. The active area 52 is formed in the substrate 51. The active area 52 is defined by an isolation oxide layer 53 formed on the substrate 51. The active area 52 is divided into three parts 41, 42, and 43.

In the part 41 of the active region 52, seven n-type source/drain regions 11A, 12A, 13A, 14A, 15A, 16A, and 17A are formed in the substrate 51 to be separated and to be electrically isolated from one another. The source/drain regions 11A, 12A, 13A, 14A, 15A, 16A, and 17A are arranged along the longitudinal axis of the active area 52. Each of the source/drain regions 11A, 12A, 13A, 14A, 15A, 16A, and 17A has a rectangular shape The source/drain region 11A is located at the middle of the part 41 of the active area 52. The source/drain regions 12A and 15A are located at each side of the source/drain region 11A. The source/drain regions 13A and 16A are located at each side of the source/drain region 11A to be adjacent to the source/drain regions 12A and 15A, respectively. The source/drain regions 14A and 17A are located at each side of the source/drain region 11A to be adjacent to the source/drain regions 13A and 16A, respectively.

The source/drain region 11A serves as the drains (or, common drain) of the MOSFETs N21 and N22. The source/drain region 12A serves as the source of the MOSFET N21 and the drain of the MOSFET N31. The source/drain region 13A serves as the source of the MOSFET N31 and the drain of the MOSFET N41. The source/drain region 14A serves as the source of the MOSFET N41. The source/drain region 15A serves as the source of the MOSFET N22 and the drain of the MOSFET N32. The source/drain region 16A serves as the source of the MOSFET N32 and the drain of the MOSFET N42. The source/drain region 17A serves as the source of the MOSFET N42.

An electrically-conductive layer 21A, which has a U-shaped pattern, is formed over the substrate 51 through a gate oxide layer 54 to be overlapped with the part 41 of the active area 52 at its two arms. An overlapped part 21Aa of the layer 21A is located between the source/drain regions 11A and 12A. Another overlapped part 21Ab of the layer 21A is located between the source/drain regions 11A and 15A. A connection part 21Ac of the layer 21A is located outside the active area 52 on the left-hand side in FIG. 9. The overlapped parts 21Aa and 21Ab serve as gate electrodes of the MOSFETs N21 and N22, respectively.

An electrically-conductive layer 22A, which has a U-shaped pattern, is formed over the substrate 51 through the gate oxide layer 54 to be overlapped with the active area 52 at its two arms. An overlapped part 22Aa of the layer 22A is located between the source/drain regions 13A and 14A. Another overlapped part 22Ab of the layer 22A is located between the source/drain regions 15A and 16A. A connection part 22Ac of the layer 22A is located outside the active area 52 on the left-hand side in FIG. 9. The overlapped parts 22Aa and 22Ab serve as gate electrodes of the MOSFETs N41 and N32, respectively.

An electrically-conductive layer 23A, which has a U-shaped pattern, is formed over the substrate 51 through the gate oxide layer 54 to be overlapped with the active area 52 at its two arms. An overlapped part 23Aa of the layer 23 is located between the source/drain regions 12A and 13A. Another overlapped part 23Ab of the layer 23A is located between the source/drain regions 16A and 17A. A connection part 23Ac of the layer 23A is located outside the active area 52 on the right-hand side in FIG. 9. The overlapped parts 23Aa and 23Ab serve as gate electrodes of the MOSFETs N31 and N42, respectively.

An electrically-conductive contact 32 is formed on the source/drain region 11A to be contacted therewith. The source/drain region 11A, which serves as the drain regions of the MOSFETs N21 and N22, is electrically connected to the output terminal OUT through the contact 32.

An electrically-conductive contact 31 is formed on the source/drain region 14A to be contacted therewith. The source/drain region 14A, which serves as the source region of the MOSFET N41, is electrically connected to the ground through the contact 31.

An electrically-conductive contact 33 is formed on the source/drain region 17A to be contacted therewith. The source/drain region 17A, which serves as the source region of the MOSFET N42, is electrically connected to the ground through the contact 33.

In the part 42 of the active region 52, six n-type source/drain regions 11B, 12B, 13B, 15B, 16B, 17B are formed in the substrate 51 to be separated and to be electrically isolated from one another. The source/drain regions 11B, 12B, 13B, 15B, 16B, 17B are arranged along the longitudinal axis of the active area 52. Each of the source/drain regions 11B, 12B, 13B, 15B, 16B, 17B has a rectangular shape.

The source/drain region 11B is located at the middle of the part 42 of the active area 52. The source/drain regions 12B and 15B are located at each side of the source/drain region 11B. The source/drain regions 13B and 16B are located at each side of the source/drain region 11B to be adjacent to the source/drain regions 12B and 15B, respectively. The source/drain regions 17A and 17B are located at each side of the source/drain region 113 to be adjacent to the source/drain regions 13B and 16B, respectively.

The source/drain region 11B serves as the drains (or, common drain) of the MOSFETs N23 and N24. The source/drain region 12B serves as the source of the MOSFET N23 and the drain of the MOSFET N33. The source/drain region 13B serves as the source of the MOSFET N33 and the drain of the MOSFET N43. The source/drain region 17A serves as the source of the MOSFET N43. The source/drain region 15B serves as the source of the MOSFET N24 and the drain of the MOSFET N34. The source/drain region 16B serves as the source of the MOSFET N34 and the drain of the MOSFET N44. The source/drain region 17B serves as the source of the MOSFET N44.

An electrically-conductive layer 21B, which has a U-shaped pattern, is formed over the substrate 51 through the gate oxide layer 54 to be overlapped with the part 41 of the active area 52 at its two arms. An overlapped part 21B*a* a of the layer 21B is located between the source/drain regions 11B and 12B. Another overlapped part 21B*b* of the layer 21B is located between the source/drain regions 11B and 15B. A connection part 21B*c* of the layer 21B is located outside the active area 52 on the left-hand side in FIG. 9. The overlapped parts 21B*a* and 21B*b* serve as gate electrodes of the MOSFETs N23 and N24, respectively.

An electrically-conductive layer 22B, which has a U-shaped pattern, is formed over the substrate 51 through the gate oxide layer 54 to be overlapped with the active area 52 at its two arms. An overlapped part 22B*a* of the layer 22B is located between the source/drain regions 13B and 17A. Another overlapped part 22B*b* of the layer 22B is located between the source/drain regions 15B and 16B. A connection part 22B*c* of the layer 22B is located outside the active area 52 on the left-hand side in FIG. 9. The overlapped parts 22B*a* and 22B*b* serve as gate electrodes of the MOSFETs N43 and N34, respectively.

An electrically-conductive layer 23B, which has a U-shaped pattern, is formed over the substrate 51 through the gate oxide layer 54 to be overlapped with the active area 52 at its two arms. An overlapped part 23B*a* of the layer 23B is located between the source/drain regions 12B and 13B. Another overlapped part 23B*b* of the layer 23B is located between the source/drain regions 16B and 17B. A connection part 23B*c* of the layer 23B is located outside the active area 52 on the right-hand side in FIG. 9 The overlapped parts 23B*a* and 23B*b* serve as gate electrodes of the MOSFETs N33 and N44, respectively.

An electrically-conductive contact 34 is formed on the source/drain region 11B to be contacted therewith. The source/drain region 11B, which serves as the drain regions of the MOSFETs N23 and N24, is electrically connected to the output terminal OUT through the contact 34.

An electrically-conductive contact 35 is formed on the source/drain region 173 to be contacted therewith. The source/drain region 17B, which serves as the source region of the MOSFET N44, is electrically connected to the ground through the contact 35.

In the part 43 of the active region 52, six n-type source/drain regions 11C, 12C, 13C, 15C, 16C, 17C are formed in the substrate 51 to be separated and to be electrically isolated from one another. The source/drain regions 11C, 12C, 13C, 15C, 16C, 17C are arranged along the longitudinal axis of the active area 52. Each of the source/drain regions 11C, 12C, 13C, 15C, 16C, 17C has a rectangular shape.

The source/drain region 11C is located at the middle of the part 43 of the active area 52. The source/drain regions 12C and 15C are located at each side of the source/drain region 11C. The source/drain regions 13C and 16C are located at each side of the source/drain region 11C to be adjacent to the source/drain regions 12C and 15C, respectively. The source/drain regions 17B and 17C are located at each side of the source/drain region 11C to be adjacent to the source/drain regions 13C and 16C, respectively.

The source/drain region 11C serves as the drains (or, common drain) of the MOSFETs N25 and N26. The source/drain region 12C serves as the source of the MOSFET N25 and the drain of the MOSFET N35. The source/drain region 13C serves as the source of the MOSFET N35 and the drain of the MOSFET N45. The source/drain region 17B serves as the source of the MOSFET N45. The source/drain region 15C serves as the source of the MOSFET N26 and the drain of the MOSFET N36. The source/drain region 16C serves as the source of the MOSFET N36 and the drain of the MOSFET N46. The source/drain region 17C serves as the source of the MOSFET N46.

An electrically-conductive layer 21C, which has a U-shaped pattern, is formed over the substrate 51 through the gate oxide layer 54 to be overlapped with the part 43 of the active area 52 at its two arms. An overlapped part 21C*a* of the layer 21C is located between the source/drain regions 11C and 12C. Another overlapped part 21C*b* of the layer 21C is located between the source/drain regions 11C and 15C. A connection part 21C*c* of the layer 21C is located outside the active area 52 on the left-hand side in FIG. 9. The overlapped parts 21C*a* and 21C*b* serve as gate electrodes of the MOSFETs N25 and N26, respectively.

An electrically-conductive layer 22C, which has a U-shaped pattern, is formed over the substrate 51 through the gate oxide layer 54 to be overlapped with the active area 52 at its two arms. An overlapped part 22C*a* of the layer 22C is located between the source/drain regions 13C And 17B. Another overlapped part 22C*b* of the layer 22C is located between the source/drain regions 15C and 16C. A connection part 22C*c* of the layer 22C is located outside the active area 52 on the left-hand side in FIG. 9. The overlapped parts 22C*a* and 22C*b* serve as gate electrodes of the MOSFETs N45 and N36, respectively.

An electrically-conductive layer 23C, which has a U-shaped pattern, is formed over the substrate 51 through the gate oxide layer 54 to be overlapped with the active area 52 at its two arms. An overlapped part 23C*a* of the layer 23C is located between the source/drain regions 12C and 13C. Another overlapped part 23C*b* of the layer 23C is located between the source/drain regions 16C and 17C. A connection part 23C*c* of the layer 23C is located outside the active area 52 on the right-hand side in FIG. 9. The overlapped parts 23C*a* and 23C*b* serve as gate electrodes of the MOSFETs N35 and N46, respectively.

An electrically-conductive contact 36 is formed on the source/drain region 11C to be contacted therewith. The source/drain region 11C, which serves as the drain regions of the MOSFETs N25 and N26, is electrically connected to the output terminal OUT through the contact 36.

An electrically-conductive contact 37 is formed on the source/drain region 17C to be contacted therewith. The source/drain region 17C, which serves as the source region of the MOSFET N46, is electrically connected to the ground through the contact 37.

With the three-input semiconductor logic device according to the second embodiment, in the same way as that in the first embodiment, when one or two ones of the first to third input signals $V_{INA}$, $V_{INB}$, and $V_{INC}$ is/are in a logic level of 1 and the remainder is/are in a logic level of 0, electric charges are stored in the corresponding source/drain regions and their neighboring parasitic capacitors.

The amount of the stored electric charges to be discharged at a next timing or clock period will be approximately the same in the above cases where one or two ones of the first to third input signals $V_{INA}$, $V_{INB}$, and $V_{INC}$ is/are in the logic level of 1 and the remainder is/are in the logic level of 0. This means that a switching speed difference of the output signal between these cases is small or zero. This leads to high-speed operation of the logic device because a necessary timing margin is extremely small.

In the above first and second embodiments, two- and three-input logic devices are explained. However, the present invention may be applied to four-or more input logic devices.

Although n-channel MOSFETs are used in the above first and second embodiments, it is needless to say that p-channel MOSFETs and any other sorts of IGFETs may be used.

Although the semiconductor logic device according to the first and second embodiments have a NAND logic, it is needless to say that the device may have any other logic function.

While the preferred forms of the present invention has been described, it is to be understood that modifications will be apparent to those skilled in the art without departing from the spirit of the invention. The scope of the invention, therefore, is to be determined solely by the following claims.

What is claimed is:

1. A two-input semiconductor logic device comprising:
   an active area formed in a semiconductor substrate; first, second, third, fourth, and fifth source/drain regions formed in said active area;
   first, second, third, and fourth gate electrodes formed over said active area through a gate insulating layer;
   said first, second, third, fourth, and fifth source/drain regions being arranged along an axis of said active area;
   said first source/drain region being located at a middle position of said active area;
   said second and fourth source/drain regions being located to be adjacent to said first source/drain region at each side of said first source/drain region;
   said third and fifth source/drain regions being located to be adjacent to said second and fourth source/drain regions, respectively;
   said first gate electrode being located between said first and second source/drain regions;
   said second gate electrode being located between said first and fourth source/drain regions;
   said third gate electrode being located between said second and third source/drain regions;
   said fourth gate electrode being located between said fourth and fifth source/drain regions;
   said first and second source/drain regions and said first gate electrode constituting a first IGFET, said first and fourth source/drain regions and said second gate electrode constituting a second IGFET, said second and third source/drain regions and said third gate electrode constituting a third IGFET, said fourth and fifth source/drain regions and said fourth gate electrode constituting a fourth IGFET;
   said first and fourth gate electrodes being electrically connected to one another to be applied with a first digital input signal;
   said second and third gate electrodes being electrically connected to one another to be applied with a second digital input signal;
   said third and fifth source/drain regions being electrically connected to one another; and
   a digital output signal being derived from said first source/drain region or said electrically-connected third and fifth source/drain regions.

2. A device as claimed in claim 1, wherein one of said first source/drain region and said electrically-connected third and fifth source/drain regions from which said output signal is not derived is/are electrically connected to a power supply line or a ground line.

3. A device as claimed in claim 1, wherein said output signal has a NAND logic with respect to said first and second input signals.

4. A three-input semiconductor logic device comprising:
   an active area formed in a semiconductor substrate;
   first to nineteenth source/drain regions formed in said active area;
   and first to eighteenth gate electrodes formed over said active area through a gate insulating layer;
   said first to nineteenth source/drain regions being arranged along an axis of said active area;
   said second and fifth source/drain regions being located to be adjacent to said first source/drain region at each side of said first source/drain region;
   said third and sixth source/drain regions being located to be adjacent to said second and fifth source/drain regions, respectively;
   said fourth and seventh source/drain regions being located to be adjacent to said third and sixth source/drain regions, respectively;
   said first gate electrode being located between said first and second source/drain regions;
   said second gate electrode being located between said first and fifth source/drain regions;
   said third gate electrode being located between said second and third source/drain regions;
   said fourth gate electrode being located between said fifth and sixth source/drain regions;
   said fifth gate electrode being located between said third and fourth source/drain regions;
   said sixth gate electrode being located between said sixth and seventh source/drain regions;
   said first and second gate electrodes being electrically connected to one another to be applied with a first digital input signal;
   said third and sixth gate electrodes being electrically connected to one another to be applied with a second digital input signal;
   said fourth and fifth gate electrodes being electrically connected to one another to be applied with a third digital input signal;

said ninth and eleventh source/drain regions being located to be adjacent to said eighth source/drain region at each side of said eighth source/drain region;

said tenth and twelfth source/drain regions being located to be adjacent to said ninth and eleventh source/drain regions, respectively;

said seventh and thirteenth source/drain regions being located to be adjacent to said tenth and twelfth source/drain regions, respectively;

said seventh gate electrode being located between said eighth and ninth source/drain regions;

said eighth gate electrode being located between said eighth and eleventh source/drain regions;

said ninth gate electrode being located between said ninth and tenth source/drain regions;

said tenth gate electrode being located between said tenth and seventh source/drain regions;

said eleventh gate electrode being located between said eighth and eleventh source/drain regions;

said twelfth gate electrode being located between said twelfth and thirteenth source/drain regions;

said seventh and eighth gate electrodes being electrically connected to one another to be applied with said second input signal;

said ninth and twelfth gate electrodes being electrically connected to one another to be applied with said first input signal;

said tenth and eleventh gate electrodes being electrically connected to one another to be applied with said third input signal;

said fifteenth and seventeenth source/drain regions being located to be adjacent to said fourteenth source/drain region at each side of said fourteenth source/drain region;

said sixteenth and eighteenth source/drain regions being located to be adjacent to said fifteenth and seventeenth source/drain regions, respectively;

said thirteenth and nineteenth source/drain regions being located to be adjacent to said sixteenth and eighteenth source/drain regions, respectively;

said thirteenth gate electrode being located between said fourteenth and fifteenth source/drain regions;

said fourteenth gate electrode being located between said fourteenth and seventeenth source/drain regions;

said fifteenth gate electrode being located between said fifteenth and sixteenth source/drain regions;

said sixteenth gate electrode being located between said seventeenth and eighteenth source/drain regions;

said seventeenth gate electrode being located between said thirteenth and sixteenth source/drain regions;

said eighteenth gate electrode being located between said eighteenth and nineteenth source/drain regions;

said thirteenth and fourteenth gate electrodes being electrically connected to one another to be applied with said third input signal;

said fifteenth and eighteenth gate electrodes being electrically connected to one another to be applied with said second input signal;

said sixteenth and seventeenth gate electrodes being electrically connected to one another to be applied with said first input signal;

said first and second source/drain regions and said first gate electrode constitute a first IGFET, said first and fifth source/drain regions and said second gate electrode constitute a second IGFET, said second and third source/drain regions and said third gate electrode constitute a seventh IGFET, said fifth and sixth source/drain regions and said fourth gate electrode constitute an eighth IGFET, said third and fourth source/drain regions and said fifth gate electrode constitute a thirteenth IGFET, said sixth and seventh source/drain regions and said sixth gate electrode constitute a fourteenth IGFET, said eighth and ninth source/drain regions and said seventh gate electrode constitute a third IGFET, said eighth and eleventh source/drain regions and said eighth gate electrode constitute a fourth IGFET, said ninth and tenth source/drain regions and said ninth gate electrode constitute a ninth IGFET, said eleventh and twelfth source/drain regions and said eleventh gate electrode constitute a tenth IGFET, said seventh and tenth source/drain regions and said tenth gate electrode constitute a fifteenth IGFET, said twelfth and thirteenth source/drain regions and said twelfth gate electrode constitute a sixteenth IGFET, said fourteenth and fifteenth source/drain regions and said thirteenth gate electrode constitute a fifth IGFET, said fourteenth and seventeenth source/drain regions and said fourteenth gate electrode constitute a sixth IGFET, said fifteenth and sixteenth source/drain regions and said fifteenth gate electrode constitute an eleventh IGFET, said seventeenth and eighteenth source/drain regions and said sixteenth gate electrode constitute a twelfth IGFET, said thirteenth and sixteenth source/drain regions and said seventeenth gate electrode constitute a seventeenth IGFET, said eighteenth and nineteenth source/drain regions and said eighteenth gate electrode constitute an eighteenth IGFET; and a digital output signal being derived from said electrically-connected first, eighth, and fourteenth source/drain regions or said electrically-connected fourth, seventh, thirteenth, and nineteenth source/drain regions.

5. A device as claimed in claim 4, wherein one of said electrically-connected first, eighth, and fourteenth source/drain regions and said electrically-connected fourth, seventh, thirteenth, and nineteenth source/drain regions from which said output signal is not derived are electrically connected to a power supply line or a ground line.

6. A device as claimed in claim 4, wherein said output signal has a NAND logic with respect to said first, second, and third input signals.

* * * * *